(12) United States Patent
Grosso

(10) Patent No.: US 10,113,529 B2
(45) Date of Patent: Oct. 30, 2018

(54) APPARATUS FOR CONVERTING WAVE ENERGY INTO ELECTRICAL ENERGY

(71) Applicant: Gilles Grosso, Six-Fours-les-Plages (FR)

(72) Inventor: Gilles Grosso, Six-Fours-les-Plages (FR)

(*) Notice: Subject to any disclaimer, the term of this patent is extended or adjusted under 35 U.S.C. 154(b) by 0 days.

(21) Appl. No.: 15/529,724

(22) PCT Filed: Nov. 30, 2015

(86) PCT No.: PCT/FR2015/053257
§ 371 (c)(1),
(2) Date: May 25, 2017

(87) PCT Pub. No.: WO2016/087757
PCT Pub. Date: Jun. 9, 2016

(65) Prior Publication Data
US 2017/0328339 A1   Nov. 16, 2017

(30) Foreign Application Priority Data
Dec. 1, 2014  (FR) ...................................... 14 61694

(51) Int. Cl.
*F03B 13/10* (2006.01)
*F03B 13/12* (2006.01)
(Continued)

(52) U.S. Cl.
CPC ........ *F03B 13/1815* (2013.01); *H01L 41/113* (2013.01); *H02N 2/18* (2013.01); *F05B 2260/407* (2013.01); *H01L 41/0835* (2013.01)

(58) Field of Classification Search
CPC ...... F03B 13/1815; H01L 41/113; H02N 2/18
See application file for complete search history.

(56) References Cited

U.S. PATENT DOCUMENTS

| 4,685,296 A | 8/1987 | Burns |
| 6,194,815 B1 | 2/2001 | Carroll |
| (Continued) | | |

FOREIGN PATENT DOCUMENTS

GB        2 091 815 A      8/1982

OTHER PUBLICATIONS

International Search Report dated Mar. 24, 2016 of corresponding application No. PCT/FR2015/053257; 6 pgs.

*Primary Examiner* — Tulsidas C Patel
*Assistant Examiner* — Thomas Quigley
(74) *Attorney, Agent, or Firm* — Maier & Maier, PLLC

(57) ABSTRACT

An apparatus for converting wave energy into electrical energy including a float element excited at a defined frequency by the waves. A power extraction system collaborates with the float element to convert mechanical energy into electrical energy, the mechanical energy coming from the movement of the float element excited by the waves. The power extraction system takes the form of a frequency amplifier made up of at least two piezoelectric motors each composed of at least one piezoelectric post excited at a frequency higher than that of the float, and a member for activating said piezoelectric motors acting on the piezoelectric motors so as to squash said piezoelectric posts. Each piezoelectric motor has a mechanical amplification device connected to rollers and includes a) jaws able to apply mechanical stress to the posts, b) a lever acting on the jaws with a proximal end connected to said jaws and a distal end connected to a roller in contact with the member so as to activate said piezoelectric motor.

11 Claims, 7 Drawing Sheets

(51) Int. Cl.
   *F03B 13/18*    (2006.01)
   *H01L 41/113*   (2006.01)
   *H02N 2/18*     (2006.01)
   *H01L 41/083*   (2006.01)

(56) References Cited

U.S. PATENT DOCUMENTS

2002/0121844 A1* 9/2002 Ghandi .................... H02N 2/18
                                                 310/339
2011/0260582 A1  10/2011 Lee et al.
2011/0260583 A1* 10/2011 Lee ......................... F03D 9/25
                                                 310/339
2012/0104761 A1  5/2012 Vamvas \* cited by examiner

APPARATUS FOR CONVERTING WAVE ENERGY INTO ELECTRICAL ENERGY

TECHNICAL FIELD OF THE INVENTION

The subject matter of the invention is an apparatus for converting wave energy into electrical energy.

It relates to the technical field of the recovery of wave energy and conversion thereof into usable energy, and more precisely conversion thereof into electrical energy.

PRIOR ART

Numerous documents describe the use of sea energies and in particular wave energy for producing electrical energy. It represents a considerable reservoir of energy and could contribute significantly to the energy mix of nations benefitting from a propitious wave climate if it is used effectively. In addition, wave energy, generally referred to as marine wave energy, appears to be one of the natural renewable energies that is particularly interesting for three aspects:

- its mean density is ten times higher than that of solar energy and five times higher than that of wind energy,
- its predictable character since it can be predicted 3 to 4 days in advance as against a few hours only for wind energy,
- its availability, which may attain more than 50% depending on the system.

Despite these numerous advantages this energy remains very difficult to exploit and few techniques proposed have made it possible to effect profitable and effective exploitation thereof.

A very large number of technical solutions have been proposed up until now. Currently more than 100 projects can be counted (such as for example the documents U.S. Pat. No. 7,355,293 (SEABASED AB) or U.S. Pat. No. 8,456,030 (OCEAN POWER TECHNOLOGIES INC)) proposing systems generally composed of three parts:

- a system for converting wave energy into mechanically exploitable energy, more precisely a system for converting the kinetic energy of a movable part excited by the wave into a mechanically exploitable energy. The energy generated is in different forms depending on the system proposed. It may for example be in the form of hydraulic energy, pneumatic energy, kinetic energy or potential energy;
- a system for converting this mechanical energy into electrical energy, also referred to as a power-extraction system. This system will depend on the type of conversion chosen in the previous paragraph and may be in various forms such as for example a turbine or a generator;
- a system for converting electrical energy allowing connection to the grid and aimed at smoothing the energy production (supercapacitor, inertia wheel, etc).

The numerous failures occurring on the various wave energy recovery projects have shown the need for a certain number of design rules:

- the systems must be small so as to limit the engagement of the sea and to provide better allocation of the movable volume.
- it is necessary to provide a fallback strategy when faced with storms,
- it is necessary to take into account the constraints related to maintenance and repair of the system.

The physical principles used for extracting power generally use the induction effect of an electromagnetic alternator. Though other effects have been proposed, few have been implemented. The use of piezoelectric polymer of the PVDF type is noted, the yields experienced of which are very low, as well as developments using electroactive polymers (EAPs).

A study (Thiam, A. G., Pierce, A. D.: Feasibility of using Piezoelectric in the conversion of ocean wave energy—First Annual MREC Technology Conference) on the power density that can be extracted by a piezoelectric ceramic element has been carried out, and shows the need for frequency pumping for the use of such materials. The piezoelectric effect is at present the effect most used for extracting power from vibrating mechanical systems. At these vibration scales, these materials, coupled to so-called "charge extraction" non-linear circuits, afford significant gains in performance. However, very few concepts have been proposed aimed at the use of piezoelectric ceramics with a high coupling coefficient for extracting wave energy.

The document EP 2 284 386 (MACTAGGART SCOTT LTD), which proposes a converter for transforming kinetic wave energy into electrical energy usable on the grid, is particularly known. This system comprises a float element placed on the surface of the water or in the water and being attached to a power-extraction system. This system has no piezoelectric material and is in the form of a hydraulic system secured to the seabed. Although this system makes it possible to convert the mechanical energy coming from the kinetic energy of the float element into electrical energy, it is not very efficient and does not make it possible to produce electricity in large quantities. In addition, the system proposed is very fragile and can easily be damaged during storms and therefore in strong waves.

In particular, the patent documents U.S. Pat. No. 4,685,296 (BURNS JOSEPH R) and US 2012/104761 (VAMVAS VASSILIOS) present an apparatus for converting wave energy into electrical energy, comprising a float element with which a power-extraction system collaborates. Although the apparatus proposed in these documents has motors equipped with piezoelectric posts, the performance thereof remains very limited and does not allow a large electrical-energy yield.

The invention aims to remedy this state of affairs. In particular, one objective of the invention is to propose an apparatus for extracting wave energy more efficiently than the known apparatus of the prior art.

Another objective of the invention is to provide a robust apparatus, making it possible to withstand strong waves, such as for example during a storm.

DISCLOSURE OF THE INVENTION

The solution proposed by the invention is an apparatus for converting wave energy into electrical energy, comprising:
- a float element excited by the wave at a defined frequency,
- a power-extraction system collaborating with the float element in order to convert mechanical energy into electrical energy, said mechanical energy coming from the movement of the float element excited by said wave.

This invention is remarkable in that said power-extraction system is in the form of a frequency amplifier composed of:
- at least two piezoelectric motors each composed of at least one piezoelectric post excited at a frequency higher than that of said float, a member for activating said piezoelectric motors, said member acting on the piezoelectric motors so as to squash said piezoelectric posts, each piezoelectric motor comprising a mechanical amplification device, said device being connected to rollers and comprising:
- jaws which, when they are acted on, apply a mechanical stress to said posts,
- a lever acting on the jaws so as to stress them, said lever comprising a proximal end attached to said jaws and a distal end attached to a roller, said roller being in contact with the member so as to activate said piezoelectric motor.

It is also remarkable in that said power extraction system comprises an oscillating arm composed of a first end attached to said member and a second end attached to said float, so that said arm transfers the mechanical energy coming from the movement of said float to said member.

This configuration allows the manufacture of a more efficient device having greater energy yield and being more robust than existing devices. This is because the use of the piezoelectric properties of ceramics makes it possible to improve the efficiency of conversion of wave energy into electrical energy.

Other advantageous features of the invention are listed below. Each of these features can be considered alone or in combination with the remarkable features defined above, said remarkable features being able to be the subject matter, where applicable, of one or more divisional applications:
- the power-extraction system may be composed of a drive ring, said drive ring comprising a plurality of adjacent motors placed and fixed in a star on a circular support, said motors being placed so that the rollers situated on the distal end of their levers are in contact with the member, said rollers cooperating with said member so as to transfer their mechanical energy to said lever,
- the member may be in the form of an undulating circular cam on which the rollers move,
- the undulating circular cam may comprise 2N+1 protrusions, with N being equal to the number of motors,
- the power-extraction system may be composed of a plurality of drive rings aligned axially with respect to one another,
- the drive rings may be installed so that each of their cams is offset angularly,
- a gearbox may be placed between the member and the oscillating arm so as to increase the rotation speed of the cam,
- the post may be composed of an alternation of piezoelectric ceramic elements and electrodes stacked axially,
- the post may be connected to an electronic circuit, said circuit being suitable for increasing the quantity of electrical energy produced by said post,
- the oscillating arm may be an articulated arm,
- the apparatus may comprise a mechanical fixing interface enabling it to be fixed to an external structure.

The invention also relates to an installation for converting wave energy into electrical energy. This installation is remarkable in that it is composed of a plurality of items of apparatus, said items of apparatus being installed on an external structure. This external structure may be a floating structure or a submerged structure installed on a seabed.

DESCRIPTION OF THE FIGURES

Other advantages and features of the invention will emerge better from a reading of the description of a preferred embodiment that follows, with reference to the accompanying drawings, produced by way of indicative and non-limitative examples, and on which.

PREFERRED EMBODIMENTS OF THE INVENTION

The apparatus proposed in the invention is in the form of a float element attached to a power-extraction system, more particular a piezoelectric generator. The latter is composed of a plurality of piezoelectric motors assembled together and subjected to a mechanical force derived from waves. The apparatus comprises a float element excited by the waves and which transfers kinetic energy to an oscillating arm. This arm makes it possible to rotate a shaft placed at the input of the piezoelectric generator and thus to transfer the mechanical energy created to the piezoelectric motors, which will subsequently convert it into electrical energy.

Figure 1:
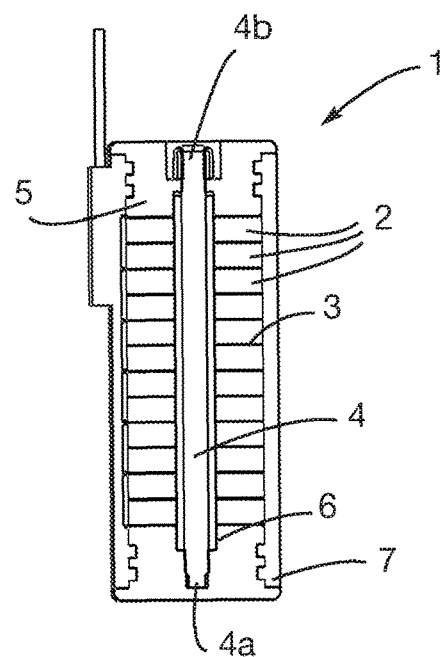
FIG. 1 is a schematic view in cross section of a post used in an apparatus according to the invention.

FIG. 1 shows a post 1 constituting the apparatus according to the invention. It is composed of a stack of piezoelectric ceramic elements 2 that preferentially comprises between two and fifty ceramic elements 2 but may comprise a larger number thereof, such as for example 150. These ceramic elements 2 preferentially have a perforated circular cross section, a diameter that may vary from 1 cm to 20 cm, and a thickness of between 1 mm and 100 mm. The holes present in each ceramic element 2 are made so as to be able to align them. During stacking, the ceramic elements 2 alternate with electrodes 3 with the same cross section and similar dimensions. These are manufactured from a conductive material, such as for example copper or bronze.

The holes present at the center of the ceramic elements 2 and the electrodes 3 make it possible to form a central hole coaxial with the post 1. This central hole enables a rod 4 to pass, allowing the centering, alignment and holding of the ceramic elements 2 and electrodes 3. In one embodiment, the rod 4 has fixing means 4a, 4b situated on each of its ends and making it possible to hold it in a given position. These fixing means 4a, 4b may for example be in the form of threads for screwing holding elements 5. These elements 5 may be nuts, bolts or any other form suiting a person skilled in the art.

In a preferred embodiment, metal parts 5 are placed on each of the ends of the rod 4 so as grip the stack of electrodes 3 and ceramic elements 2. These parts 5 are preferably made from metal but may be produced from a rigid material such as steel or ceramic.

The posts 1 may have insulation means. For example, the rod 4 may be placed in a sleeve 6 manufactured from an insulating material such as for example wood, rubber or polystyrene. Each post 1 may also have external protection 7 for insulating it electrically from the rest of the apparatus and thus improving safety during use thereof.

Figure 2:
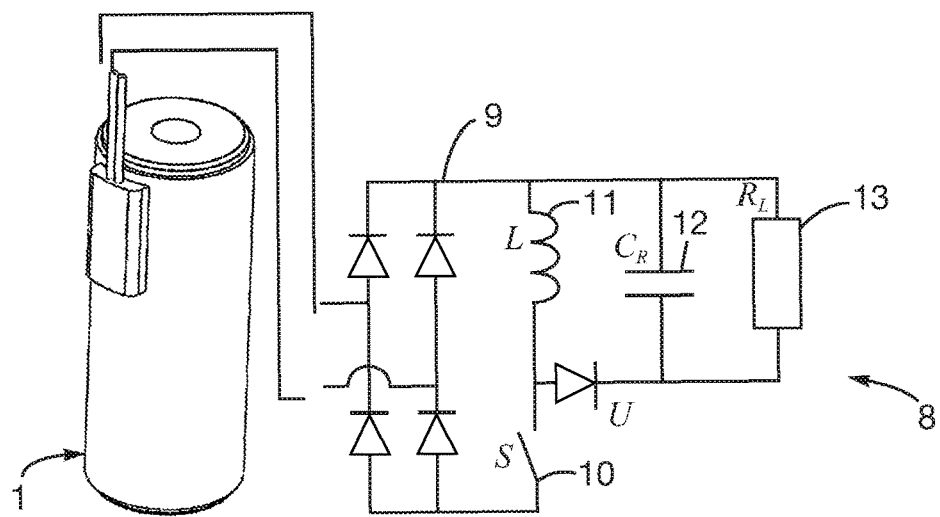
FIG. 2 is a schematic view of the post in FIG. 1 combined with a charge-extraction circuit.

As shown by FIG. 2, the post 1 is connected to an electronic so-called charge-extraction circuit 8. Although only one post 1 is shown, in practice it is possible for a circuit 8 to be connected simultaneously to a plurality of posts 1.

This circuit 8 recovers the electrical energy produced by the piezoelectric post 1. It is preferentially composed of a voltage-rectifying bridge 9 and a high-voltage switch 10 as well as a coil 11 and a filtering capacitor 12. All these components, known to persons skilled in the art, serve to maximize the electrical energy produced by the posts 1. Thus the circuit 8 used will make it possible to extract the maximum amount of electrical energy produced by each of the posts 1. This configuration makes it possible to double the electrical energy harvested by recovering it on a first occasion when the posts 1 are squashed and on a second occasion when they are released.

In one embodiment, the electronic circuit 8 has a temporary storage system 13, such as for example a battery or a bank of supercapacitors. This temporary storage system 13 thus makes it possible to store the electricity produced by the posts 1 before it is processed for use on the grid.

Figure 3:
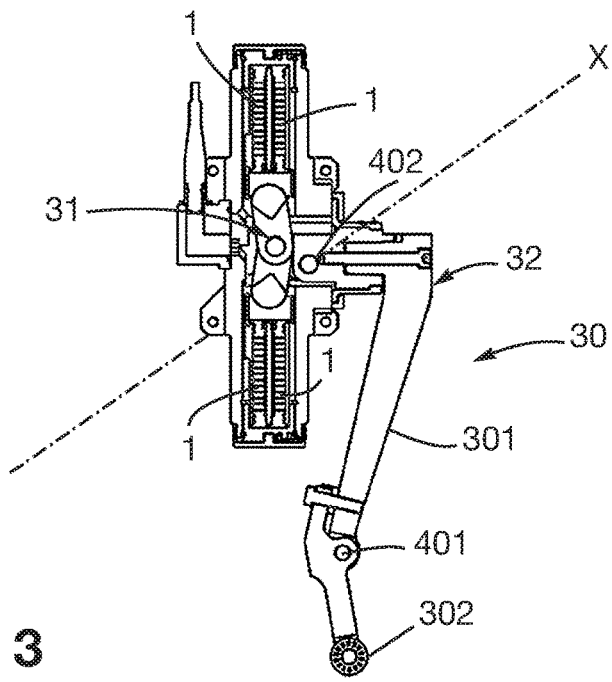
FIG. 3 is a schematic view of a piezoelectric motor comprising posts of FIG. 1 and a mechanical amplification device.

FIG. 3 shows a piezoelectric motor 30 constituting the apparatus of the invention. This is composed of two pairs of posts 1 but may comprise a larger number thereof. In the configuration described, the pairs of posts 1 are put in opposition with respect to each other. This configuration makes it possible to reduce by half the deformation of the posts 1 while keeping the same force. Although this configuration is favored, the piezoelectric motor 30 may comprise any quantity of posts 1, such as for example an assembly comprising between 1 and 40 posts.

In order to produce electricity, it is necessary to apply a mechanical stress to the piezoelectric ceramic elements 2. To produce this stress, the motor 30 consists of a mechanical amplification device 31, 32 for effecting a squashing of the posts 1. This device comprises:

a means 31 for squashing each of the posts 1 and able to be in the form of jaws;

a means 32 in the form of a lever 301 exerting a force on the two jaws of the system 31 so as to open them in order to squash the posts 1. They synergic effect of the two means 31, 32 affords an amplification of the force that may range from a factor of 10 to 1000.

In order to obtain squashing of the posts 1, a force is applied at the end of the lever 301 of the means 32. A shown in FIG. 4a, the motors 30 are preferentially placed and fixed in a star on a circular support 304 so as to form the drive ring 70. The lever 301 has a distal end and a proximal end. The distal end of the lever 301 comprises a roller 302 that rolls on an undulating circular cam 303. The roller 302 is connected to the lever 301 by fixing means 401 that may be in the form of an articulation, a screw or a bolt and nut system.

Its proximal end is connected to the jaws of the means 31 by fixing means 402 enabling it to transfer the force acting on the lever 301 to said jaws. Although this configuration allowing a rotation movement about an axis x in order to open the jaws and to enable the latter to squash the posts 1 is favored, any other type of movement, such as for example a translation movement, can be envisaged with a view to squashing the posts 1.

Figure 4A:
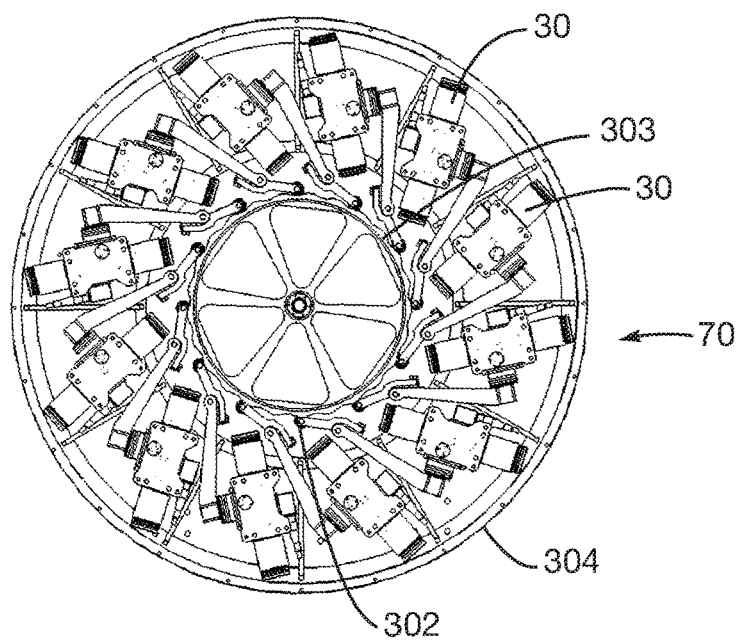
FIG. 4a is a schematic view of a drive ring composed of piezoelectric motors of FIG. 3.
Figure 4B:
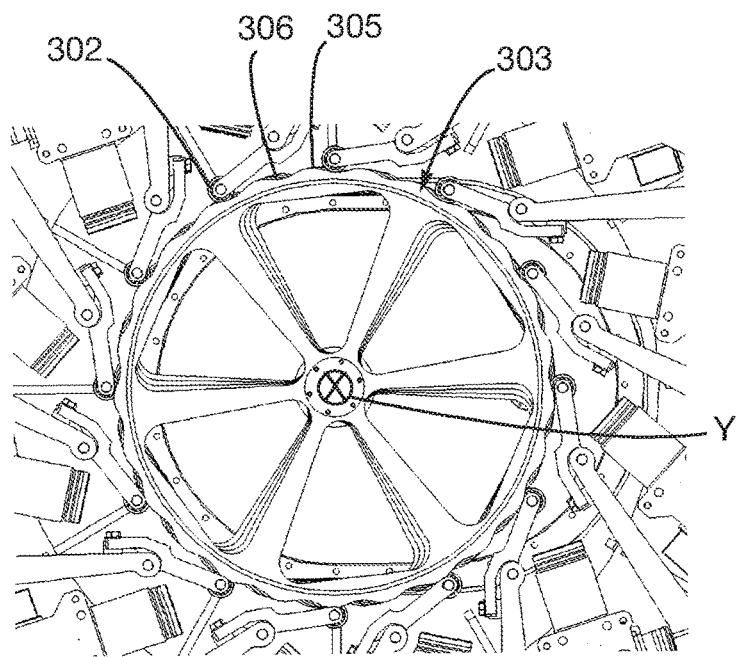
FIG. 4b is a schematic view of a cam making up the drive ring of FIG. 4a, FIG. 5 is a schematic view of an assembly of a plurality of drive rings.

The cam 303, shown in FIGS. 4a and 4b, has an alternation of protrusions 305 and hollows 306. The protrusions 305 form contact points making it possible, when said cam 303 rotates and the rollers 302 pass, to exert a maximum mechanical force on the lever arm 301. Although this embodiment is favored, the protrusions 305 and the rollers 302 may be replaced by magnets so as to afford a contactless transmission of force.

When the motors 30 are placed on the circular support 304, an adjustment of the lever 301 makes it possible to obtain a controlled contact force when the roller 302 is situated in the hollow 306 present between two protrusions 305. This adjustment makes it possible to obtain an equivalent radial force for each motor 30 and to provide mechanical contact between the rollers 302 and the cam 303 when they pass in the hollows 306. The contact points created are distributed so as to minimize the tangential forces applied to the cam 303 and thus to increase the number of motors 30 without increasing the force to be supplied.

Preferentially, each drive ring 70 comprises N piezoelectric motors 30, and therefore N rollers 302 distributed evenly over the circumference of the cam 303. This configuration makes it possible to distribute the force so that it is not applied to all the rollers 302 at the same time. This is because the rollers 302 roll on the cam 303 so that, for a given time, some rollers move on protrusions 305 while the opposite rollers 302 move in hollows 306. The cam 303 therefore preferentially comprises aN+1 protrusions. The integer number a, preferably equal to two, is chosen so that the number of protrusions 305 is greater that the number of posts 1. Thus the tangential forces exerted on the piezoelectric motors 3 best compensate for each other in order to reduce the resulting tangential force. A different number of protrusions 305 may however be envisaged. It is possible for example to have a number of protrusions 305 equal to a multiple of the number of posts 1. In this particular case, the resulting tangential force is equal to the sum of the tangential forces of the piezoelectric motors 30.

The number of protrusions 305 also makes it possible to amplify the frequency of the primary excitation issuing from the float 41 and coming from the wave. This is because, for each turn of the cam 303, each of the piezoelectric motors 30 is excited aN+1 times. Thus, whereas the wave frequency may only range up to one wave every 8 to 10 seconds, this system makes it possible to obtain a squashing of the poles 1 having a frequency that may range up to 200 times per second. This feature thus makes it possible to increase the frequency of the force applied for squashing the posts 1, and therefore to increase the efficiency of electrical-energy production of the motors 30.

The cam 303 has diameter that may vary from 20 cm to 3 m, and is manufactured from a rigid weather-resistant material, such as for example stainless steel, aluminum or a combination of the two.

The number of motors 3 placed in a star and fixed around the cam 303 may vary according to the energy efficiency required for the apparatus. FIG. 4a shows a drive ring 70 thus formed and able to contain between 1 and 20 piezoelectric motors 30.

Figure 5:
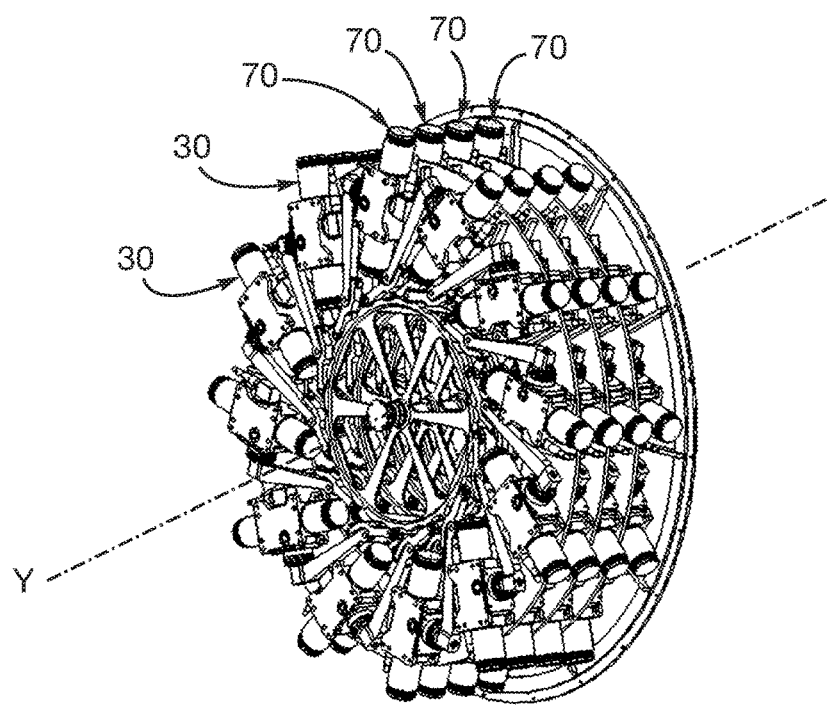

As shown by FIG. 5, it is also possible to axially stack a plurality of drive rings 70, the cams 303 of which are secured to the same output shaft 44. They are stacked along an axis y that is the rotation axis of the cams 303. These rings 70 are offset from one another by an angle of $2\pi/(M(aN+1))$, thus making it possible to limit the resulting tangential force by avoiding applying a simultaneous force to all the protrusions 305 (M being the number of drive rings 70 and N the number of rollers 303). It is thus possible to increase the energy efficiency of the apparatus.

Figure 6A:
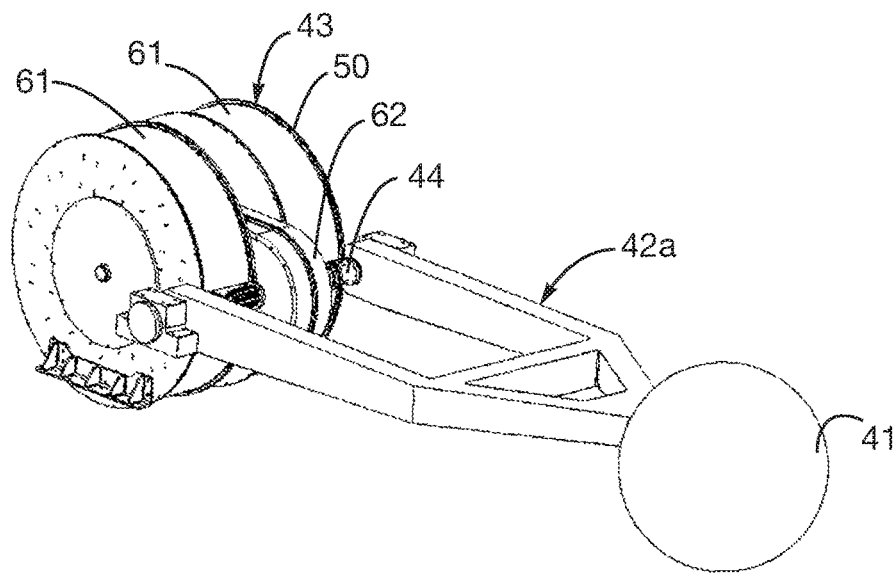
FIG. 6a is a schematic view of an apparatus according to the invention.
Figure 6B:
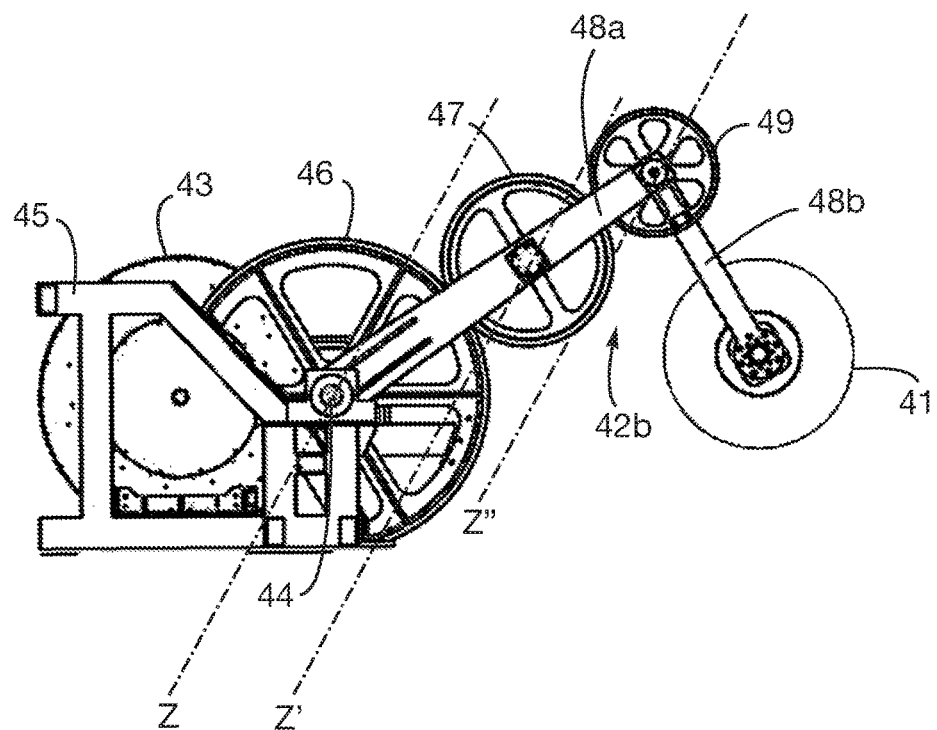
FIG. 6b is a schematic view of an apparatus according to the invention, this being composed of an articulated arm.

The mechanic stress applied to the poles 1 when they are squashed is produced by means of the effect of the wave on the apparatus. FIGS. 6a and 6b show embodiments of apparatus according to the invention. They comprise a float element 41 that may be spherical, conical, cylindrical or any other shape suiting a person skilled in the art. They may be manufactured from any material suiting a person skilled in the art, such as for example wood, aluminum, or polystyrene. This float element 41 is attached to an arm 42a, 42b starting to oscillate when the wave moves said float element 41. This arm 42a, 42b connects the float element 41 to the piezoelectric generator 43 by means of an input shaft 44. When the oscillating arm 42a, 42b moves, the input shaft 44 makes a rotation movement that is transmitted to the piezoelectric generator 43.

Figure 7A:
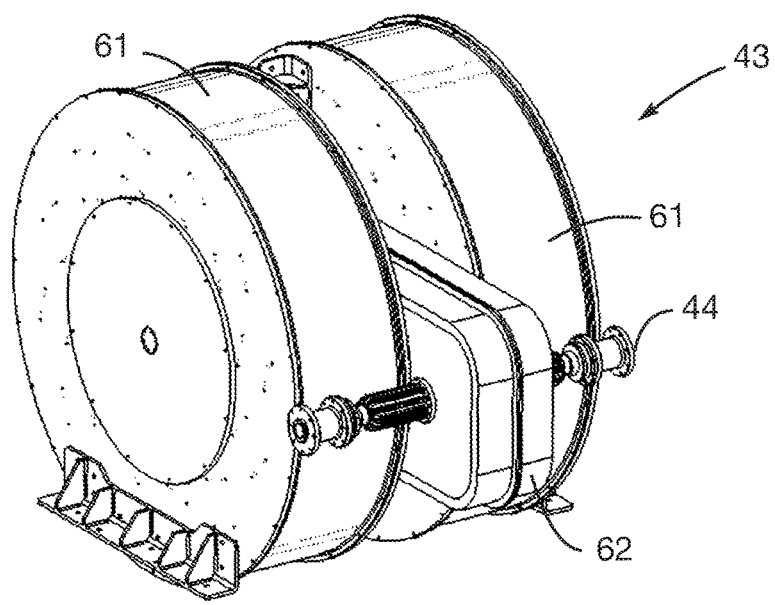
FIG. 7a is a schematic representation of the power-extraction system used in the apparatus of the invention.

The piezoelectric generator 43 is shown in FIG. 7a. It can be installed on a chassis 45 thus making it possible to fix it to a reference structure such as a frame or a high-inertia float. It is composed of two blocks 61 and a casing 62 containing a gearbox 63 (shown in more detail in FIG. 7b). Each of the blocks 61 consists of one (FIG. 4a) or more (FIG. 5) drive rings 70.

The energy efficiency of the poles 1 is determined by the geometry and number of drive rings 70 as well as by the piezoelectric properties of the material. In order to increase this efficiency, an amplification of the primary-excitation frequency, namely the excitation of the float 41 by the wave, can be obtained by means of the use of a gearbox 62. The latter is placed between the shaft 44 of the drive rings 70 and the oscillating arm 42a, 42b. It thus makes it possible to amplify the rotation speed of the shaft 44 by a factor that may range from 10 to 1000.

Figure 7B:
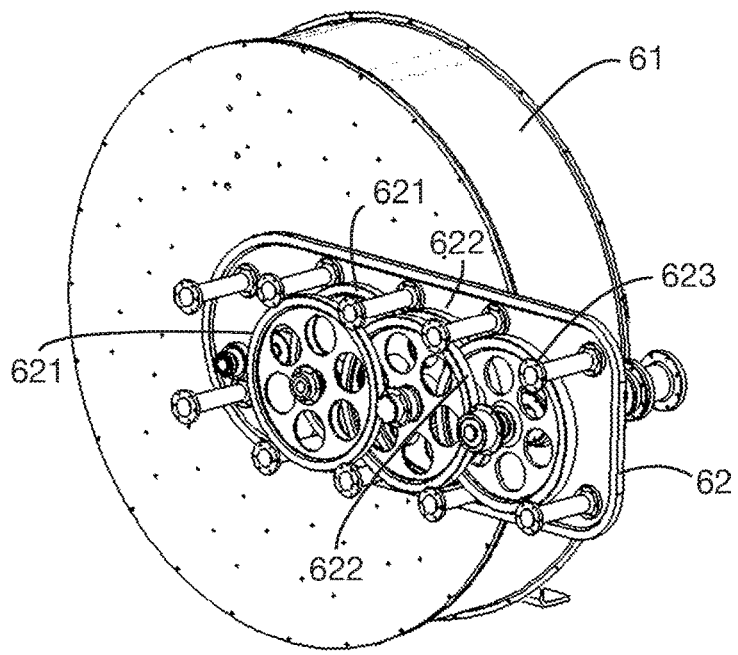
FIG. 7b is a schematic view in cross section of the system in FIG. 6a, FIG. 8 is a schematic view of the apparatus of FIG. 4b including a fairing.

In the embodiment in FIG. 7a, two blocks of stacks 61 of drive rings 70 are placed on either side of a gearbox 62. As shown in FIG. 7b, each stack has its output pinion, secured to the common shaft 44 and in engagement with a first toothed wheel 621 that is itself in engagement with a second toothed wheel 622. This device is duplicated for each stack 61. A third toothed wheel 623, common to the two stacks 61, is in engagement with the second toothed wheels 622, and secured to the shaft 44. This gearbox 62 thus affords an amplification of frequency by increasing the rotation speed of the shaft 44 and therefore the angular speed of the cams 303.

In the configuration shown in FIG. 6b, the arm 42b is articulated and is broken down into two parts connected together by gears. This is because the arm 42b is composed of two secondary arms 48a, 48b connected together by a fixing means 490, this means 490 being able to be in the form of a screw, a nut and bolt system or any other means suiting a person skilled in the art. Two toothed wheel sectors 46 are fixed to the chassis 45 and two intermediate toothed wheels 47 are mounted on the main arm 48a so as to be free to rotate about an axis z parallel to the input shaft 44. Each of these intermediate wheels 47 being in engagement with a toothed-wheel sector 46 rotating about an axis z' as well as with a third toothed wheel 49 rotating about an axis z" and secured to the secondary arm 48b. The other end of the secondary arm 48b is attached to the float 41. This configuration makes it possible to have a greater angular movement while preserving the same angular movement for the float 41. Thus the rotation speed of the input shaft 44 of the piezoelectric generator 43 is increased and thus makes it possible to increase the frequency of the mechanical excitation that is exerted on the poles 1.

Figure 8:
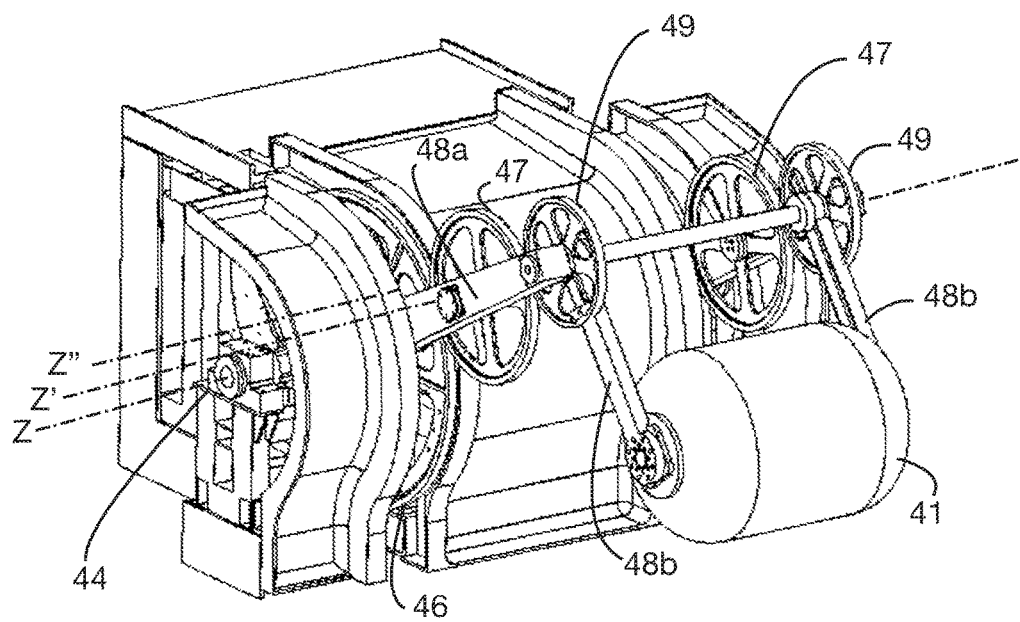

In FIG. 8, the parts constituting the piezoelectric generator 43 and the chassis 45 are faired so as to protect them from the sea and any other attack from the environment, thus making it possible to obtain a durable weather-resistant apparatus. The fairing is produced from a material resistant to air and to water, such as for example stainless steel, aluminum or a composite material.

Figure 9:
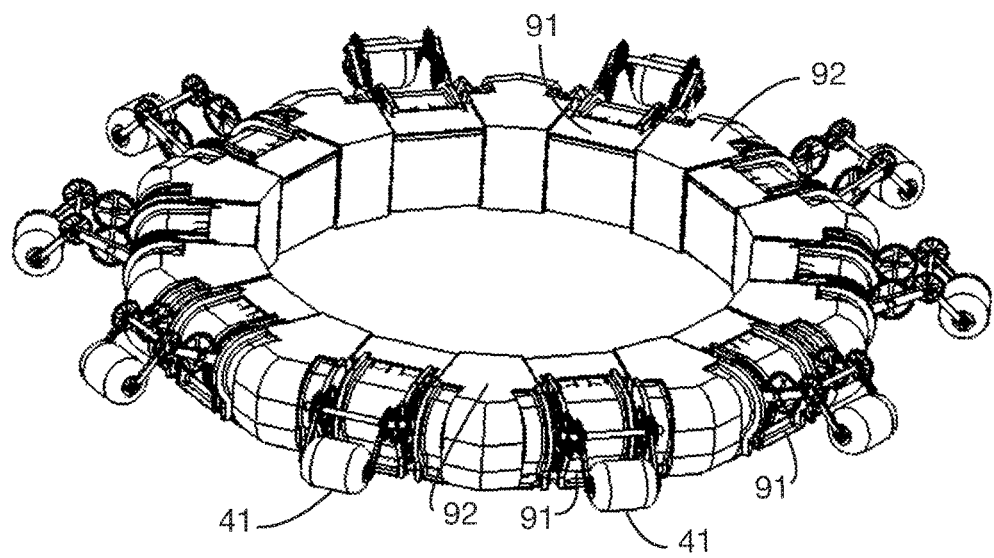
FIG. 9 is a schematic view of an installation of a plurality of items of apparatus according to the invention.

In the system shown in FIG. 9, a plurality of items of apparatus according to the invention are assembled with one another via a metal structure 91 and float elements 92. This structure 91 may be circular, hexagonal, linear or any other form suiting a person skilled in the art. However, the use of the apparatus is not limited to this type of structure 91. It may for example be installed on a built or floating external structure 91 such as for example a dyke, a quay, a barge, an offshore platform, a boat or any other structure allowing a relative movement between it and the float. It may also be configured so as to be able to be anchored on the seabed by means, for example, of fixing means such as a chain, mooring buoy and mooring line device. The number of items of apparatus installed on an external structure 91 may vary, and is between 1 and 100.

In one embodiment, the structure 91 is coupled to other offshore electricity-production systems, such as wind turbines, water turbines or any other wave-motor system. This makes it possible to benefit from infrastructures already present such as anchoring or storage infrastructures, infrastructures for connection to the grid, or servicing or maintenance infrastructures.

Figure 10:
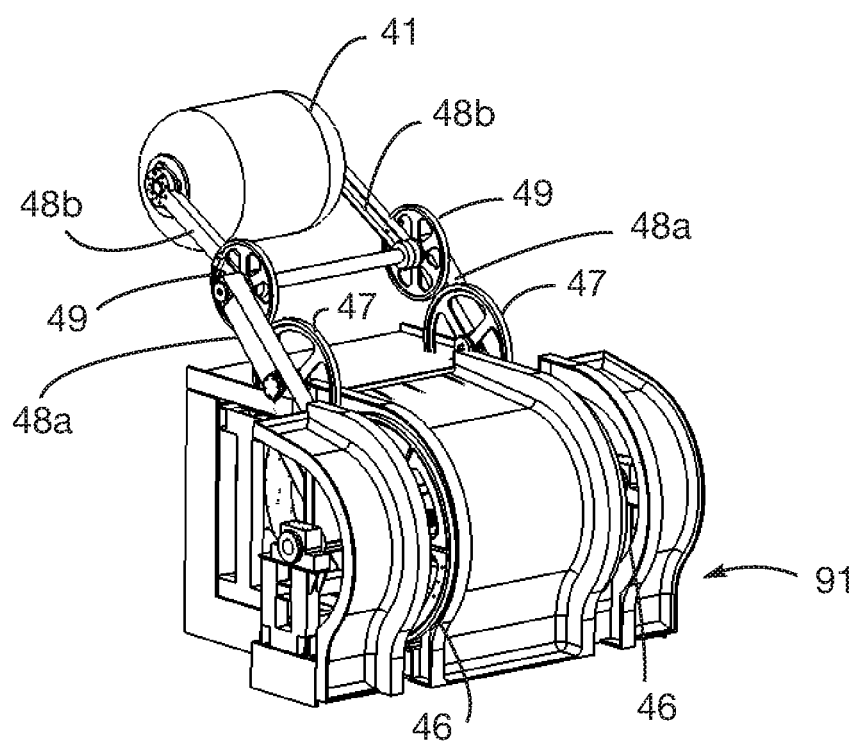
FIG. 10 is a schematic view of the apparatus in the folded position.

In the embodiment in FIG. 10, the apparatus is provided with a motor which may for example be hydraulic, electric or compressed air. This motor makes it possible to fold and lock the floats 41 and their arms 42a, 42b in the event of a storm.

The arrangement of the various elements and/or means and/or steps of the invention, in the embodiments described above, must not be understood as requiring such an arrangement in all implementations. In any event, it would be understood that various modifications can be made to these elements and/or means and/or steps without departing from the spirit and scope of the invention. In particular:

the number of posts 1 used may vary, the type of material used for the electrodes 3 may be different, the number of ceramic elements 2 used in each post 1 may vary from one apparatus to another, the holding elements 5 may be of various kinds, the circuit 8 making up the charge extraction system may be different from one apparatus to another, the apparatus may or may not contain a temporary storage system 13, the material use for the float 41 may be varied, the mechanical amplification systems 31, 32 may be different from one apparatus to another, the number of protrusions 305 present on the cam 303 may vary, the number of motors 30 per drive ring 70 may vary, the number of drive rings 70 per piezoelectric generator 43 may vary, the type of arm 42a, 42b may be different from one apparatus to another, the type of external structure 91 on which the apparatus is or are installed may vary, the number of items of apparatus installed on the external structure 91 is variable, the articulated arm 42b may be used in apparatus having applications other than that described in the document, the system for increasing the frequency of squashing of the posts 1 may be used in any apparatus, whatever its use, such as for example in apparatus installed in electromagnetic, hydraulic or mechanical systems, the cam 303 may be replaced by an undulating rack, the cam 303 may be used with another type of motor that is not piezoelectric, such as for example in electromechanical, hydraulic or mechanical systems, the arm 42a, 42b may be used to actuate other types of motor, such as for example motors present in electromagnetic, hydraulic or mechanical systems.

The invention claimed is:

1. Apparatus for converting wave energy into electrical energy, comprising:
   a float element excited by a wave at a defined frequency,
   a power-extraction system collaborating with the float element in order to convert mechanical energy into electrical energy, said mechanical energy coming from the movement of the float element excited by said wave,
   wherein said power-extraction system is in the form of a frequency amplifier composed of:
   at least two piezoelectric motors each composed of at least one piezoelectric post excited at a frequency higher than that of said float,
   a member for activating said piezoelectric motors, said member acting on the piezoelectric motors so as to squash said piezoelectric posts,
   each piezoelectric motor comprising a mechanical amplification device, said device being connected to rollers and comprising:
   a) jaws which, when they are acted on, apply a mechanical stress to said posts,
   b) a lever acting on the jaws so as to stress them, said lever comprising a proximal end attached to said jaws and a distal end attached to a roller, said roller being in contact with the member so as to activate said piezoelectric motor,
   and wherein said power extraction system comprises an oscillating arm composed of a first end attached to said member and a second end attached to said float, so that said arm transfers the mechanical energy coming from the movement of said float to said member.

2. The apparatus according to claim 1, wherein the power-extraction system is composed of a drive ring, said drive ring comprising a plurality of adjacent motors placed and fixed in a star on a circular support, said motors being placed so that the rollers situated on the distal end of their levers are in contact with the member, said rollers cooperating with said member so as to transfer their mechanical energy to said lever.

3. The apparatus according to claim 2, wherein the member is an undulating circular cam on which the rollers move.

4. The apparatus according to claim 3, wherein the undulating circular cam comprises 2N+1 protrusions, with N being equal to the number of motors.

5. The apparatus according to claim 3, wherein the power-extraction system is composed of a plurality of drive rings aligned axially with respect to one another.

6. The apparatus according to claim 5, wherein the drive rings are installed so that each of their cams is offset angularly.

7. The apparatus according to claim 3, wherein a gearbox is placed between the member and the oscillating arm so as to increase the rotation speed of the cam.

8. The apparatus according to claim 1, wherein the post is composed of an alternation of piezoelectric ceramic elements and electrodes stacked axially.

9. The apparatus according to claim 1, wherein the post is connected to an electronic circuit, said circuit being suitable for increasing the quantity of electrical energy produced by said post.

10. The apparatus according to claim 1, wherein the oscillating arm is an articulated arm.

11. The apparatus according to claim 1, further comprising a mechanical fixing interface enabling it to be fixed to an external structure.

* * * * *